United States Patent
Caspary et al.

(10) Patent No.: US 10,566,424 B2
(45) Date of Patent: Feb. 18, 2020

(54) SEMICONDUCTOR DEVICE, SILICON WAFER AND METHOD OF MANUFACTURING A SILICON WAFER

(71) Applicant: Infineon Technologies AG, Neubiberg (DE)

(72) Inventors: Nico Caspary, München (DE); Helmut Oefner, Zorneding (DE); Hans-Joachim Schulze, Taufkirchen (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 15/820,770

(22) Filed: Nov. 22, 2017

(65) Prior Publication Data

US 2018/0097064 A1   Apr. 5, 2018

Related U.S. Application Data

(63) Continuation of application No. 15/247,200, filed on Aug. 25, 2016, now abandoned.

(30) Foreign Application Priority Data

Aug. 26, 2015   (DE) .................. 10 2015 114 177

(51) Int. Cl.
| | |
|---|---|
| H01L 29/10 | (2006.01) |
| H01L 29/167 | (2006.01) |
| H01L 29/739 | (2006.01) |
| H01L 29/78 | (2006.01) |
| H01L 29/861 | (2006.01) |
| C30B 15/04 | (2006.01) |

(Continued)

(52) U.S. Cl.
CPC .......... *H01L 29/1095* (2013.01); *C30B 15/04* (2013.01); *C30B 29/06* (2013.01); *C30B 30/04* (2013.01); *H01L 29/167* (2013.01); *H01L 29/7393* (2013.01); *H01L 29/7802* (2013.01); *H01L 29/861* (2013.01)

(58) Field of Classification Search
None
See application file for complete search history.

(56) References Cited

U.S. PATENT DOCUMENTS

| | | |
|---|---|---|
| 7,651,566 B2 | 1/2010 | Kirscht et al. |
| 9,054,035 B2 | 6/2015 | Schulze et al. |

(Continued)

FOREIGN PATENT DOCUMENTS

| | | |
|---|---|---|
| DE | 10 2012 020 785 A1 | 4/2014 |
| DE | 10 2013 216 195 A1 | 2/2015 |

(Continued)

*Primary Examiner* — Bo B Jang
(74) *Attorney, Agent, or Firm* — Design IP (57) ABSTRACT

A method of manufacturing a silicon wafer is provided that includes extracting an n-type silicon ingot over an extraction time period from the a silicon melt comprising n-type dopants; adding p-type dopants to the silicon melt over at least part of the extraction time period, thereby compensating an n-type doping in the n-type silicon ingot by 10% to 80%; slicing the silicon ingot; forming hydrogen related donors in the silicon wafer by irradiating the silicon wafer with protons; and annealing the silicon wafer subsequent to the forming of the hydrogen related donors in the silicon wafer.

24 Claims, 5 Drawing Sheets

(51) Int. Cl.
*C30B 29/06* (2006.01)
*C30B 30/04* (2006.01)

(56) References Cited

U.S. PATENT DOCUMENTS

| | | |
|---|---|---|
| 9,245,811 B2 | 1/2016 | Ploss et al. |
| 9,559,020 B2 | 1/2017 | Ploss et al. |
| 2006/0286753 A1 | 12/2006 | Barthelmess et al. |
| 2015/0050754 A1* | 2/2015 | Ploss .................... H01L 21/261 438/10 |
| 2015/0349066 A1 | 12/2015 | Caspary et al. |

FOREIGN PATENT DOCUMENTS

| | | |
|---|---|---|
| DE | 20 2015 102 716 U1 | 7/2015 |
| JP | S59 190292 A | 10/1984 |
| JP | S61 163188 A | 7/1986 |
| JP | H3 199193 A | 8/1991 |
| JP | H3 247585 A | 11/1991 |
| JP | H10 29894 A | 2/1998 |
| JP | 2003 048798 A | 2/2003 |
| JP | 2004 307305 A | 11/2004 |
| JP | 2006 344977 A | 12/2006 |
| JP | 2010 531805 A | 9/2010 |
| JP | 2011 93778 A | 5/2011 |
| JP | 2012136398 A | 7/2012 |
| JP | 2013 87008 A | 5/2013 |
| JP | 2015 037194 A | 2/2015 |
| WO | 2009003183 A1 | 12/2008 |

* cited by examiner

SEMICONDUCTOR DEVICE, SILICON WAFER AND METHOD OF MANUFACTURING A SILICON WAFER

CROSS REFERENCE TO RELATED APPLICATIONS

This application is a continuation of U.S. patent application Ser. No. 15/247,200, filed Aug. 25, 2016, which claims the benefit of German Patent Application No. 10 2015 114 177.9 filed Aug. 26, 2015, which are incorporated by reference as if fully set forth.

BACKGROUND

In silicon devices such as insulated gate bipolar transistors (IGBTs), diodes, insulated gate field effect transistors (IGFETs), for example metal oxide semiconductor field effect transistors (MOSFETs) a number of requirements need to be met. Such requirements typically depend upon specific application conditions. Typically, trade-offs between linked characteristics such as, for example high electrical breakdown voltage and low on-state resistance have to be found. Avalanche breakdown events and undesired formation of inversion channels, for example at silicon to oxide interfaces that may occur during operation of the semiconductor device may have a negative impact on device robustness and device reliability.

As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method are used. In the Czochralski method, silicon is heated in a crucible to the melting point of silicon at around 1416° C. to produce a melt of silicon. A small silicon seed crystal is brought in contact with the melt. Molten silicon freezes on the silicon seed crystal. By slowly pulling the silicon seed crystal away from the melt, a crystalline silicon ingot is grown with a diameter in the range of one or several 100 mm and a length in the range of a meter or more. In the MCZ method, additionally an external magnetic field is applied to reduce an oxygen contamination level.

Growing of silicon with defined doping by the Czochralski method is complicated by segregation effects. The segregation coefficient of a dopant material characterizes the relation between the concentration of the dopant material in the growing crystal and that of the melt. Typically, dopant materials have segregation coefficients lower than one meaning that the solubility of the dopant material in the melt is larger than in the solid. This typically leads to an increase of doping concentration in the ingot with increasing distance from the seed crystal.

It is desirable to improve robustness and reliability of silicon semiconductor devices. It is further desirable to provide a wafer as a base material for such silicon semiconductor devices and to provide a method of manufacturing the wafer.

SUMMARY

An embodiment of a semiconductor device includes a silicon semiconductor body comprising a drift or base zone of net n-type doping. An n-type doping is partially compensated by 10% to 80% with p-type dopants. A net n-type doping concentration in the drift or base zone is in a range from $1\times10^{13}$ cm$^{-3}$ to $1\times10^{15}$ cm$^{-3}$. A portion of 5% to 75% of the n-type doping is made up of hydrogen related donors.

According to another embodiment, a silicon wafer comprises a net n-type doping. An n-type doping is partially compensated by 10% to 80% with p-type dopants. The net n-type doping concentration is in a range from $1\times10^{13}$ cm$^{-3}$ to $1\times10^{15}$ cm$^{-3}$. A portion of 5% to 75% of the n-type doping is made up of hydrogen related donors.

Another embodiment refers to a method of manufacturing a silicon wafer. The method comprises extracting an n-type silicon ingot over an extraction time period from a silicon melt comprising n-type dopants. The method further comprises adding p-type dopants to the silicon melt over at least part of the extraction time period, thereby compensating an n-type doping in the n-type silicon ingot by 10% to 80%. The method further comprises slicing the silicon ingot. The method further comprises forming hydrogen related donors in the silicon wafer by irradiating the silicon wafer with protons and thereafter, annealing the silicon wafer. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the general inventive concept. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
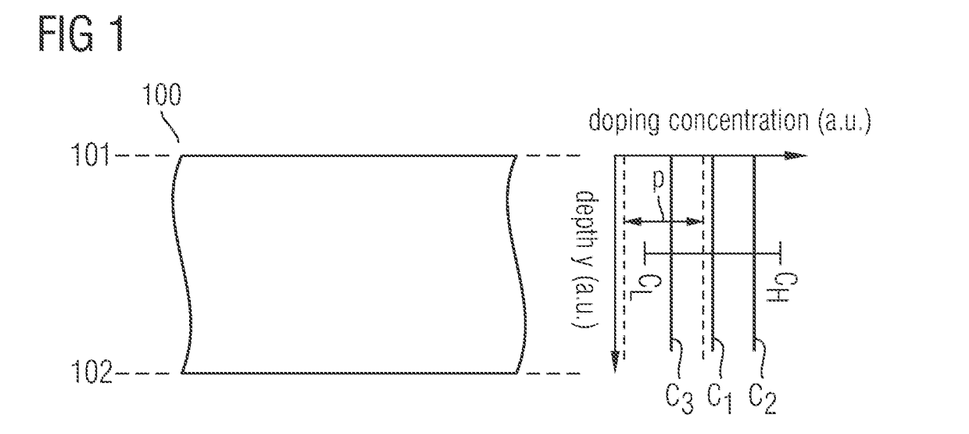
FIG. 1 illustrates a schematic cross-sectional view of a silicon wafer according to an embodiment.

FIG. 1 refers to a schematic cross-sectional view of a silicon wafer 100 according to an embodiment.

The silicon wafer 100 comprises a net n-type doping. The net n-type doping is illustrated in the schematic graph by a curve $c_1$ related to a net n-type doping concentration profile along a vertical direction y between opposite first and second surfaces 101, 102 of the silicon wafer 100. In the illustrated example, the curve $c_1$ corresponds to the difference of curve $c_2$ being a profile of n-type doping along the vertical direction y and curve $c_3$ being a profile of p-type doping along the vertical direction y. The n-type doping is partially compensated by 10% to 80% or by 20% to 80% with p-type dopants. With regard to the illustrated example, curve $c_3$ may range between a lower concentration limit $c_L$ corresponding to 10% of $c_2$ and an upper concentration limit $c_H$ corresponding to 80% of $c_2$. A portion p of 5% to 75% or of 5% to 50% of the n-type doping is made up of hydrogen related donors.

Each of the curves $c_2$ and $c_3$ may slightly deviate from a constant level due to, for example segregation effects during Czochralski crystal growth. Due to different segregation coefficients for curves $c_1$, $c_2$, also curve $c_3$ may slightly deviate from a constant level, for example show a small gradient in a vertical direction.

According to an embodiment, the n-type doping comprises phosphorus partially compensated by boron as the p-type doping.

In some embodiments, a variation of a profile of concentration of the hydrogen related donors along a vertical direction between opposite main surfaces of the silicon wafer 100 is less than 80%, or even less than 50%.

According to another embodiment, the net n-type doping is further compensated by a p-type dopant species having a segregation coefficient smaller than phosphorus. According to yet another embodiment, the net n-type doping is further compensated by a plurality of different p-type dopant species having segregation coefficients smaller than phosphorus. By carrying out partial compensation by boron having a segregation coefficient greater than phosphorus and by one or more p-type dopant species having segregation coefficients smaller than phosphorus, an effective segregation of p-type dopants during CZ growth can be adapted to the segregation behavior of phosphorus. Gallium (Ga) and aluminum (Al) are examples of p-type dopant species having a segregation coefficient smaller than phosphorus. Introduction of the hydrogen related donors allows for a fine tuning of specific resistance of the silicon wafer, thereby reducing a variation of specific resistance between wafers and increasing a yield of wafers per ingot having a specific resistance in a target range.

The silicon wafer 100 allows for semiconductor devices having improved robustness and reliability. For example, avalanche breakdown at high blocking voltages may be diminished due to a reduced carrier mobility caused by the p- and n-type dopants. Furthermore, phosphorus pile-up effects and boron pile-down effects at semiconductor to oxide interfaces, for example in an edge termination area and/or in trenches may result in an enhanced total n-type doping at the semiconductor/oxide interface allowing for a reduction of undesired inversion channel formation during device operation.

Figure 2A:
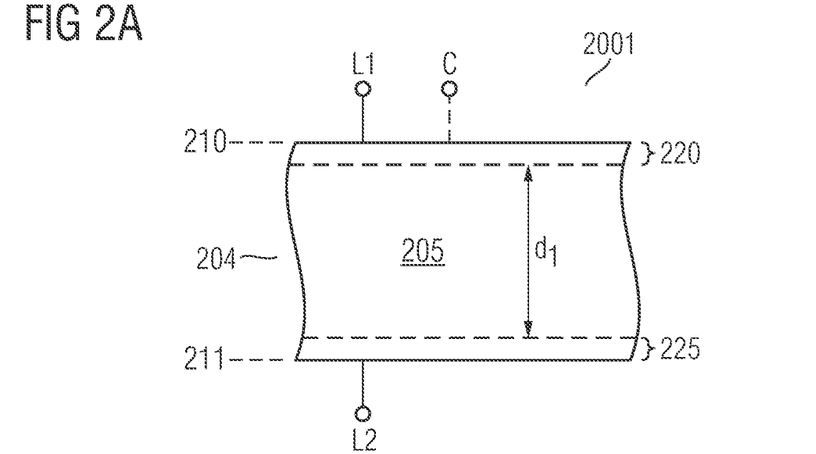
FIG. 2A illustrates a schematic cross-sectional view of a vertical semiconductor device according to an embodiment.

FIG. 2A is a schematic cross-sectional view of a portion of a vertical semiconductor device 2001 according to an embodiment. The vertical semiconductor device 2001 comprises a silicon semiconductor body 204. The silicon semiconductor body 204 may correspond to the silicon wafer 100 illustrated in FIG. 1 or may be part of the silicon wafer 100, for example a die resulting from wafer dicing. The vertical semiconductor device 2001 includes a drift zone 205 of net n-type doping. An n-type doping in the drift zone 205 is partially compensated by 10% to 80% or by 20% to 80% with p-type dopants. A portion p of 5% to 75% or of 5% to 50% of the n-type doping is made up of hydrogen related donors. The partially compensated drift zone 205 may correspond to a basic doping of a chip substrate material such as the silicon wafer 100 illustrated in FIG. 1. The resulting n-type drift zone doping $c_1$ may be between $1\times10^{13}$ cm$^{-3}$ and $1\times10^{15}$ cm$^{-3}$, or between $2\times10^{13}$ cm$^{-3}$ and $2\times10^{14}$ cm$^{-3}$, or between $3\times10^{13}$ cm$^{-3}$ and $7\times10^{13}$ cm$^{-3}$.

The vertical semiconductor device 2001 includes a first load terminal structure 220 at a first surface 210, e.g. front surface of the semiconductor body 204. The first load terminal structure 220 includes doped semiconductor region(s). The doped semiconductor region(s) may be formed by doping processes of the silicon semiconductor body 204 at the first surface 210, e.g. by diffusion and/or ion implantation processes. The doped semiconductor region(s) in the semiconductor body 204 of the first load terminal structure 220 may include doped source and body regions of a vertical power IGFET, for example a superjunction FET or of a collector of an IGBT, or of an anode or cathode region of a vertical power semiconductor diode or thyristor, for example. In the course of processing the silicon semiconductor body 204 at the first surface 210, depending on the power semiconductor device to be formed in the semiconductor body, a control terminal structure such as a planar gate structure and/or a trench gate structure including gate dielectric(s) and gate electrode(s) may be formed.

The vertical semiconductor device 2001 further includes a second load terminal structure 225 at a second surface 211, e.g. a rear surface of the silicon semiconductor body 204 opposite to the first surface 210. The second load terminal structure 225 includes doped semiconductor region(s). The doped semiconductor region(s) may be formed by doping processes of the silicon semiconductor body 204 at the second surface 211, e.g. by diffusion and/or ion implantation processes. The doped semiconductor region(s) in the silicon semiconductor body 204 of the second load terminal structure 225 may include doped field stop region(s), doped drain regions of a vertical power FET, or an emitter of an IGBT, or an anode or cathode region of a vertical power semiconductor diode, for example.

A first electrical load contact L1 to the first load terminal structure 220 and an electrical control terminal contact C to a control terminal structure, if present in the vertical power semiconductor device, are part(s) of a wiring area above the first surface 210. A second electrical load contact L2 to the second load terminal structure 225 is provided at the second surface 211. The electrical load contacts L1, L2 and the electrical control terminal contact C may be formed of one or a plurality of patterned conductive layers such as metallization layers electrically isolated by interlevel dielectric layer(s) sandwiched between. Contact openings in the interlevel dielectric layer(s) may be filled with conductive material(s) to provide electrical contact between the one or the plurality of patterned conductive layers and/or active area(s) in the silicon semiconductor body such as the first load terminal structure 220, for example. The patterned conductive layer(s) and interlevel dielectric layer(s) may form the wiring area above the semiconductor body 204 at the first surface 210, for example. A conductive layer, e.g. a metallization layer or metallization layer stack may be provided at the second surface 211, for example.

In the vertical semiconductor device 2001 a current flow direction is between the first and second load terminal contacts L1, L2 along a vertical direction between the opposite first and second surfaces 210, 211.

Figure 2B:
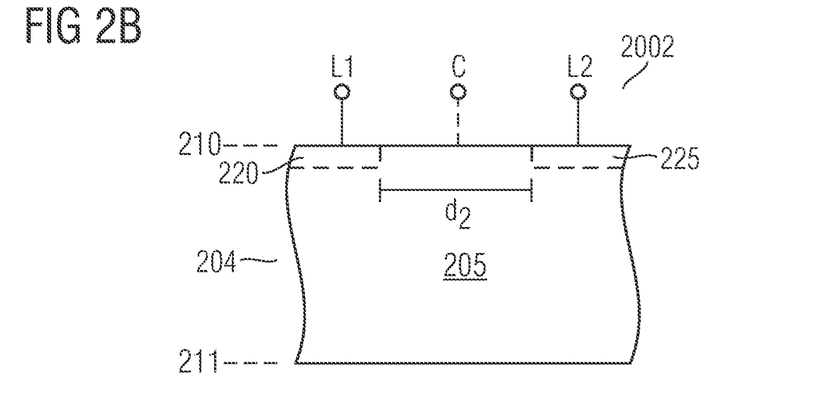
FIG. 2B illustrates a schematic cross-sectional view of a lateral semiconductor device according to an embodiment.

FIG. 2B is a schematic cross-sectional view of a portion of a lateral semiconductor device 2002 according to an embodiment. The lateral semiconductor device 2002 differs from the vertical semiconductor device 2001 in that the second load terminal structure 225 and the second contact L2 are formed at the first surface 210. The first and second load terminal structures 220, 225 may be formed simultaneously by same processes. Likewise, the first and second load terminal contacts L1, L2 may be formed simultaneously by same processes.

In the embodiments illustrated in FIGS. 2A and 2B, a blocking voltage capability of the vertical and lateral semiconductor devices 2001, 2002 can be adjusted by appropriate distances $d_1$, $d_2$ of the drift zone 205 between the first and second load terminal structures 220, 225, for example between a body region and a drain region of a FET.

Figure 3:
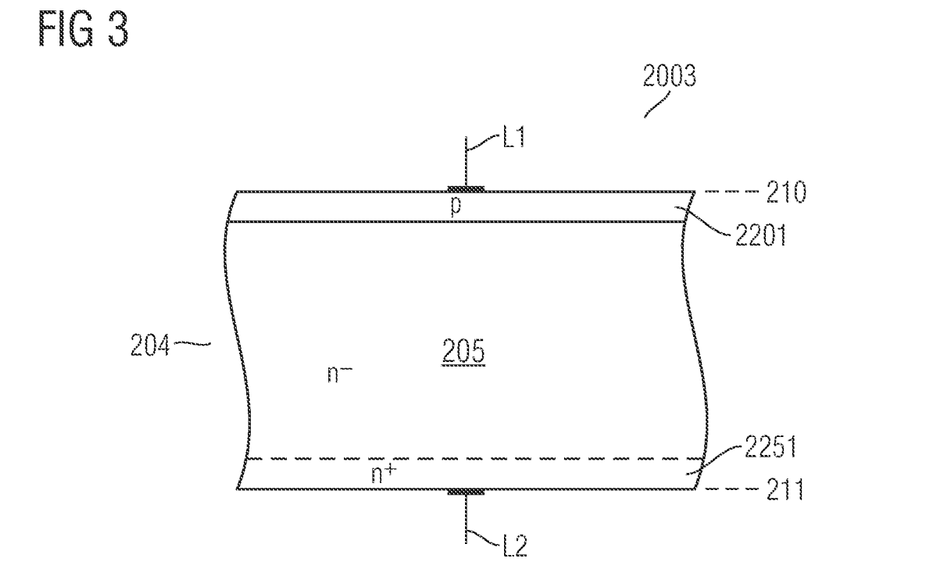
FIG. 3 illustrates a schematic cross-sectional view of a power semiconductor diode according to an embodiment.

FIG. 3 is a more detailed a schematic cross-sectional view of one example of the vertical semiconductor device 2001 being formed as a power semiconductor diode 2003. The drift zone 205 is $n^-$-doped as described in detail with regard to the semiconductor device 2001 above. A p-doped anode region 2201 at the first surface 210 is in electrical contact with the first load terminal contact L1. The p-doped anode region 2201 is an example of an element of the first load terminal structure 220 illustrated in FIG. 2A. An $n^+$-doped cathode region 2251 at the second surface 211 is in electrical contact with the second load terminal contact L2. The $n^+$-doped cathode region 2251 is an example of an element of the second load terminal structure 225 illustrated in FIG. 2A.

Figure 4:
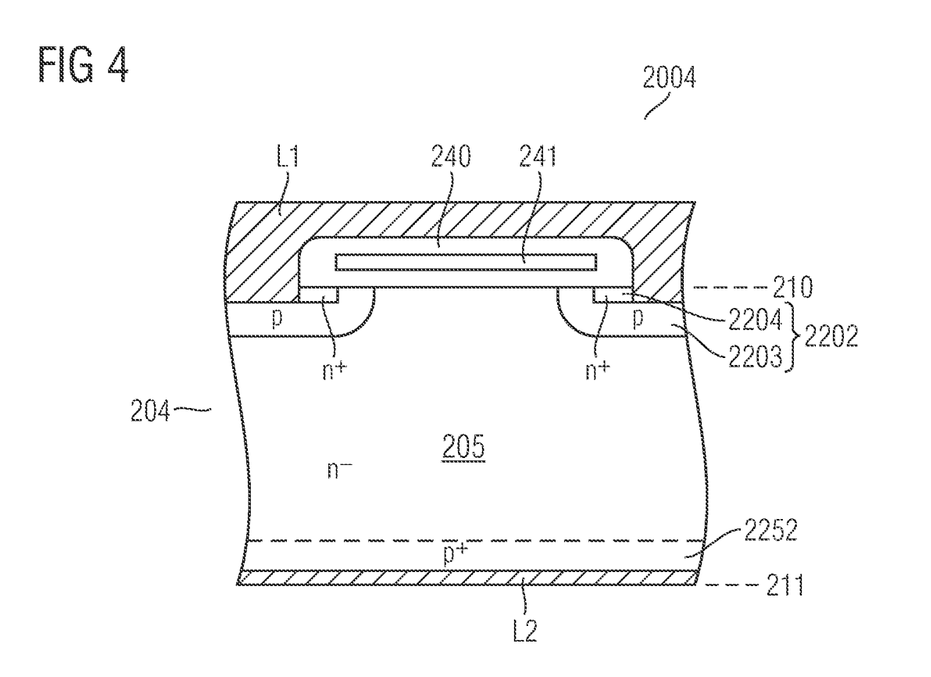
FIG. 4 illustrates a schematic cross-sectional view of a power semiconductor IGBT according to an embodiment.

FIG. 4 is a more detailed schematic cross-sectional view of one example of the vertical semiconductor device 2001 being formed as a power IGBT 2004. The drift zone 205 is $n^-$-doped as described in detail with regard to the semiconductor device 2001 above. An emitter structure 2202 at the first surface 210 includes a p-doped body region 2203 and an $n^+$-doped source region 2204. The p-doped body region 2203 and the $n^+$-doped source region 2204 are examples of elements of the first load terminal structure 220 illustrated in FIG. 2A. The emitter structure 2202 is in electrical contact with the first load terminal contact L1. A gate structure including a dielectric 240 and a gate electrode 241 is formed on the semiconductor body 205 at the first surface 210. An IGBT collector including a $p^+$-doped rear side emitter 2252 at the second surface 211 is in electrical contact to the second load terminal contact L2. The $p^+$-doped rear side emitter 2252 is an example of an element of the second load terminal structure 225 illustrated in FIG. 2A.

Figure 5:
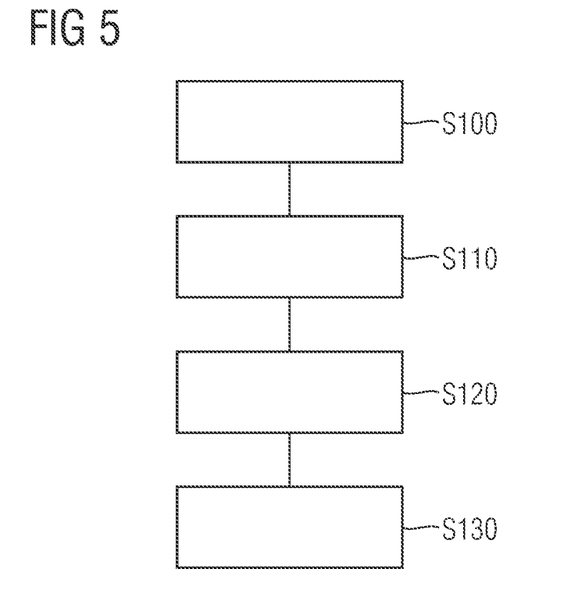
FIG. 5 is a schematic process chart illustrating a method of manufacturing a silicon wafer.

FIG. 5 refers to a method of manufacturing a silicon wafer.

Process feature S100 of the method comprises extracting an n-type silicon ingot over an extraction time period from a silicon melt comprising n-type dopants.

Process feature S110 comprises adding p-type dopants to the silicon melt over at least part of the extraction time period, thereby compensating an n-type doping in the n-type silicon ingot by 10% to 80%.

Process feature S120 comprises slicing the silicon ingot.

Process feature S130 comprises forming hydrogen related donors in the silicon wafer by irradiating the silicon wafer with protons and thereafter, annealing the silicon wafer.

In some embodiments, a portion of 5% to 75% of the n-type doping is made up of hydrogen related donors. In some embodiments, a portion of 5% to 50% of the n-type doping is made up of hydrogen related donors.

In some embodiments, irradiating the silicon wafer with protons includes an implantation dose in a range of $1\times10^{13}$ $cm^{-2}$ and $8\times10^{14}$ $cm^{-2}$, and an implantation energy in a range of 1.0 MeV and 5.0 MeV.

In some embodiments, annealing the silicon wafer is carried out in a temperature range of 350° C. and 550° C., or in a range of 460° C. and 520° C. An annealing duration may be in a range of 30 minutes and 20 hours, or in a range of 1 hour and 10 hours, for example.

In some embodiments, a thickness of the silicon wafer is reduced by removing material of the silicon wafer, thereby removing an end of range peak of proton irradiation.

In some embodiments, an electric or material characteristic of the semiconductor wafer is measured, and at least one parameter of proton irradiation and annealing is set as a function of the measured electric or material characteristic. Examples of electric or material characteristics to be measured prior to proton irradiation are doping concentration, oxygen and/or carbon concentration in case of CZ silicon wafers. Examples of proton irradiation parameters include proton irradiation dose, proton irradiation energy number of proton irradiations, annealing temperature and annealing duration.

In some embodiments, a net n-type doping concentration of the silicon ingot is in a range of $1\times10^{13}$ $cm^{-3}$ to $1\times10^{15}$ $cm^{-3}$, or in a range of $2\times10^{13}$ $cm^{-3}$ to $2\times10^{14}$ $cm^{-3}$.

In some embodiments, a ratio of segregation coefficients of n-type dopants in the drift or base zone and p-type dopants in the drift or base zone is in a range of 0.25 and 4.

In some embodiments, a segregation coefficient of an n-type dopant species of the n-type dopants and a segregation coefficient of a p-type dopant species of the p-type dopants differ by at least a factor of three.

In some embodiments, the n-type dopant species is phosphorus and the p-type dopant species is boron.

In some embodiments, the method further comprises adding, in addition to boron, a second p-type dopant species to the silicon melt over at least part of the extraction time period, second p-type dopant species having a segregation coefficient smaller than phosphorus.

In some embodiments, the second p-type dopant species corresponds to at least one of aluminum and gallium.

In some embodiments, the boron is added to the silicon melt from at least one of a boron doped quartz material or from boron in a gas phase.

In some embodiments, the boron is added to the silicon melt from a boron carbide or boron nitride source material.

In some embodiments, the boron is added to the silicon melt from a boron doped crucible.

In some embodiments, the boron doped crucible is formed by at least one of implanting boron into the crucible, diffusion of boron into the crucible and in-situ doping.

In some embodiments, the boron is implanted into the crucible at various energies and doses.

In some embodiments, the method further comprises applying a thermal budget to the crucible by heating that is configured to set a retrograde profile of the boron in the crucible.

In some embodiments, the method further comprises forming a layer at inner walls of the crucible.

In some embodiments, the method further comprises altering a rate of adding the boron to the silicon melt.

In some embodiments, altering the rate of adding the boron to the silicon melt includes altering at least one of size, geometry and rate of delivery of particles, a flow or partial pressure of a boron carrier gas.

In some embodiments, altering the rate of adding the boron to the silicon melt includes at least one of altering a depth of a source material dipped into the silicon melt and altering a temperature of the source material, wherein the source material is doped with the boron.

In some embodiments, doping of the source material is carried out by one of in-situ doping, by a plasma deposition process through a surface of the source material, by ion implantation through the surface of the source material and by a diffusion process through the surface of the source material.

In some embodiments, the method further comprises controlling a rate of adding the boron to the silicon melt by measuring a weight of the silicon ingot during the Czochralski growth process.

In some embodiments, the method further comprises controlling a rate of adding the boron to the silicon melt by optically measuring a change in dimensions of a quartz source material doped with the boron.

In some embodiments, the method further comprises altering a rate of adding the boron to the silicon melt by altering at least one of a contact area between a source material and the silicon melt and heating of the source material.

In some embodiments, adding the p-type dopants into the silicon melt includes dissolving p-type dopants from a p-type dopant source material into the silicon melt.

In an embodiment of a CZ silicon ingot, the CZ silicon ingot is doped with donors and acceptors and includes an axial gradient of doping concentration of the donors and of the acceptors. An electrically active net doping concentration, which is based on a difference between the doping concentrations of the donors and acceptors varies by less than 60% for at least 40% of an axial length of the CZ silicon ingot due to partial compensation of at least 10% of the doping concentration of the donors by the acceptors. (The electrically active net doping concentration may also vary by less than 40%, or by less than 30%, or even by less than 20% for the at least 40% of the axial length of the CZ silicon ingot. In other words, along at least 40% of the axial length of the CZ silicon ingot, the electrically active net doping concentration may vary by less than +/−30%, or by less than +/−20%, or by less than +/−15%, or even by less than +/−10% from an average electrically active net doping concentration averaged along the at least 40% of the axial length of the CZ silicon ingot. This may be caused by counteracting segregation effects of donors, which may lead to a strong variation of net doping along the axial length of the CZ silicon ingot by means of partial compensation with acceptors having another segregation behavior.

In some embodiments, the donors include at least one of phosphorus, arsenic and antimony.

In some embodiments, the acceptors include boron.

In some embodiments, the acceptors further include at least one of aluminum, gallium and indium.

In some embodiments, a net n-type doping concentration is in a range from $1\times10^{13}$ cm$^{-3}$ to $3\times10^{14}$ cm$^{-3}$, or in a range from $2\times10^{13}$ cm$^{-3}$ to $2\times10^{14}$ cm$^{-3}$.

Figure 6:
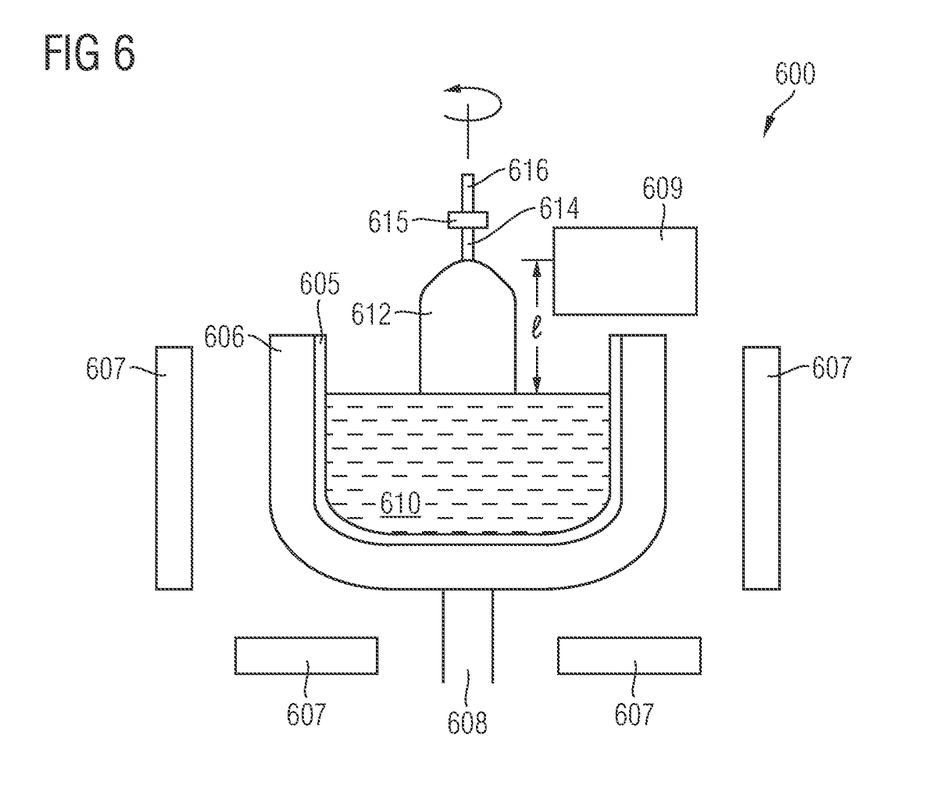
FIG. 6 is a schematic cross-sectional view of a CZ growth system for carrying out the method illustrated in FIG. 5.

FIG. 6 is a simplified schematic cross-sectional view of a CZ growth system 600 for carrying out the method illustrated in FIG. 5 and for manufacturing a CZ silicon ingot as described in the embodiments above.

The CZ growth system 600 includes a crucible 605, e.g. a quartz crucible on a crucible support 606, e.g. a graphite susceptor. A heater 607, e.g. a radio frequency (RF) coil surrounds the crucible. The heater 607 may be arranged at lateral sides and/or at a bottom side of the crucible 605. The crucible 605 may be rotated by a supporting shaft 608.

The mixture of silicon material, e.g. a non-crystalline raw material such as polysilicon and an n-type dopant material such as phosphorus (P), antimony (Sb), arsenic (As) or any combination thereof is melted in the crucible by heating via the heater 607. The n-type dopant material may already constitute or be part of the initial doping of the silicon material to be melted and/or may be added as a solid or gaseous dopant source material. According to an embodiment, the solid dopant source material is a dopant source particle such as a dopant source pill. The dopant source material may have a predetermined shape such as a disc shape, spherical shape or a cubic shape. By way of example, the shape of the dopant source material may be adapted to a supply device 609 such as a dispenser configured to supply the dopant source material to a silicon melt 610 in the crucible 605.

According to an embodiment, the dopant source material may include, in addition to the dopant material, a carrier material or a binder material. By way of example, the dopant source material may be quartz or silicon carbide (SiC) doped with the dopant material. According to another embodiment, the dopant source material may be a highly doped silicon material such as a highly doped polysilicon material that is doped to a greater extent than the silicon raw material. According to yet another embodiment, the dopant source material may be boron nitride and/or boron carbide.

A silicon ingot 612 is pulled out of the crucible 605 containing the silicon melt 610 by dipping a seed crystal 614 into the silicon melt 610 which is subsequently slowly withdrawn at a surface temperature of the melt just above the melting point of silicon. The seed crystal 614 is a single crystalline silicon seed mounted on a seed support 615 rotated by a pull shaft 616. A pulling rate which typically is in a range of a few mm/min and a temperature profile influence a diameter of the CZ grown silicon ingot 612.

When extracting the silicon ingot 612 with the CZ growth system 600 according to the method illustrated in FIG. 5, boron is added to the silicon melt 610 over an extraction time period. According to an embodiment, boron is added to the molten silicon at a constant rate. The boron may be added to the silicon melt 610 from a boron doped quartz material such as a boron doped quartz material supplied to the silicon melt 610 by the supply device 609. In addition or as an alternative, the boron may be added to the silicon melt 610 from a boron carbide or from a boron nitride source material that may also be supplied to the silicon melt 610 by the supply device 609.

Figure 7:
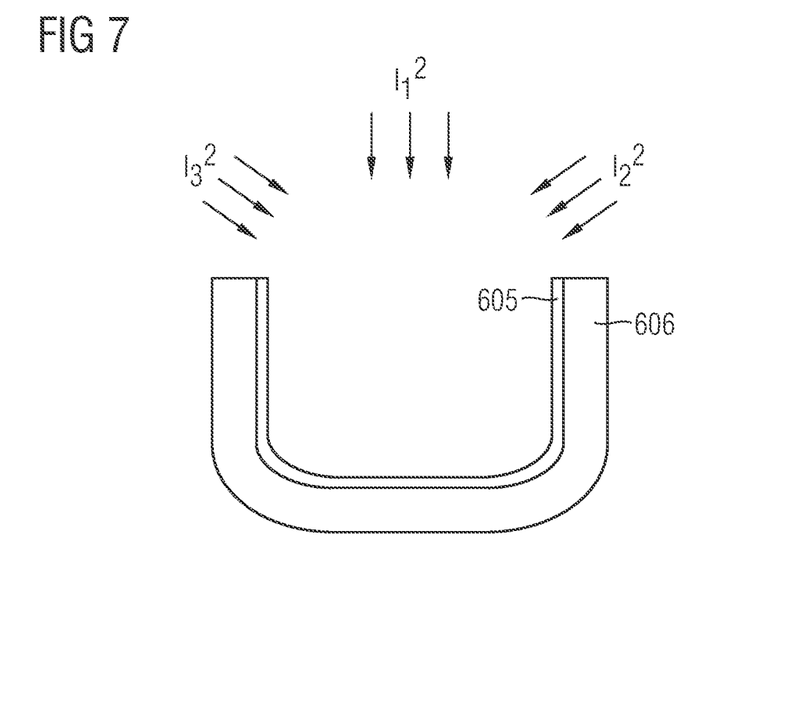
FIG. 7 is a schematic cross-sectional view of a crucible for illustrating a method of doping the crucible with dopant material.

According to another embodiment, the boron is added to the silicon melt 610 from a boron doped crucible. The boron doped crucible may be formed by implanting boron into the crucible, for example (cf. schematic cross-sectional view of FIG. 7). The boron may be implanted into the crucible 605 by one or more tilted implants, cf. labels $I_2^2$ and $I_3^2$ and/or by non-tilted implant, cf. label $I_1^2$ in FIG. 7. A distribution of tilt angle(s) may be used to adjust the amount of boron that is supplied to the silicon melt 610 by dissolving a material of the crucible 605 in the silicon melt 610, e.g. at a rate in the range of approximately 10 μm/hour in case of a crucible made of quartz. The boron may be implanted into the crucible at various energies and/or at various doses. Applying a thermal budget to the crucible 105 by heating may allow for setting a retrograde profile of the boron in the crucible 605. Multiple implants at various energies and/or doses further allow for setting a profile of the boron into a depth of the crucible 605. Thus, a rate of adding boron into the silicon melt 610 may be adjusted, i.e. by selection of implantation parameters the rate of the addition of boron can be varied and controlled in a well-defined manner. By way of example, the profile of boron in the crucible 605 may be a retrograde profile. As an alternative or in addition to implanting boron into the crucible 605, boron may also be introduced into the crucible 605 by another process, e.g. by diffusion from a diffusion source such as a solid diffusion source of boron, for example. As a further alternative or in addition to the above processes of introducing boron into the crucible 605, boron may also be introduced into the crucible 605 in-situ, i.e. during formation of the crucible 605.

According to yet another embodiment boron may be introduced into the silicon melt 610 from the gas phase, e.g. by supply of diborane ($B_2H_6$) via the supply device 609. According to an embodiment, supply of boron in the gas phase may occur via a supply of inert gas into the CZ growth system 600. According to another embodiment, supply of boron in the gas phase may occur via one or more tubes, e.g. a quartz tube extending into the silicon melt 610. According to yet another embodiment, supply of boron in the gas phase may occur via one or more tubes ending at a short distance to the silicon melt 610. The tubes may include one or more openings at an outlet, e.g. in the form of a showerhead, for example.

According to another embodiment, a liner layer may be formed on the crucible 605 for controlling diffusion of boron out of the crucible 605 into the silicon melt 610. As an example, the liner layer may be formed of quartz and/or silicon carbide. According to an embodiment, the liner layer may be dissolved in the silicon melt 610 before boron included in the crucible gets dissolved in the silicon melt 610 and serves as a dopant during the growth process of the silicon ingot 612. This allows for adjusting a point of time when boron is available in the silicon melt as a dopant to be introduced into the silicon ingot 612. The liner layer may also delay introduction of boron into the silicon melt 610 by a time period that is required for diffusion of boron from the crucible 605 through the liner layer and into the silicon melt 610.

According to another embodiment, the method of manufacturing the silicon ingot 612 further includes altering a rate of adding the boron to the silicon melt 610. According to an embodiment, altering the rate of adding the boron to the silicon melt 610 includes altering at least one of size, geometry, and rate of delivery of particles including the boron. By way of example, the rate may be increased by increasing a diameter of the particles doped with the dopant material. As an additional or alternative measure, the rate of adding the boron to the silicon melt 610 may be increased by increasing a speed of supplying the dopant source material into the silicon melt 610 by the supply device 609.

Figure 8:
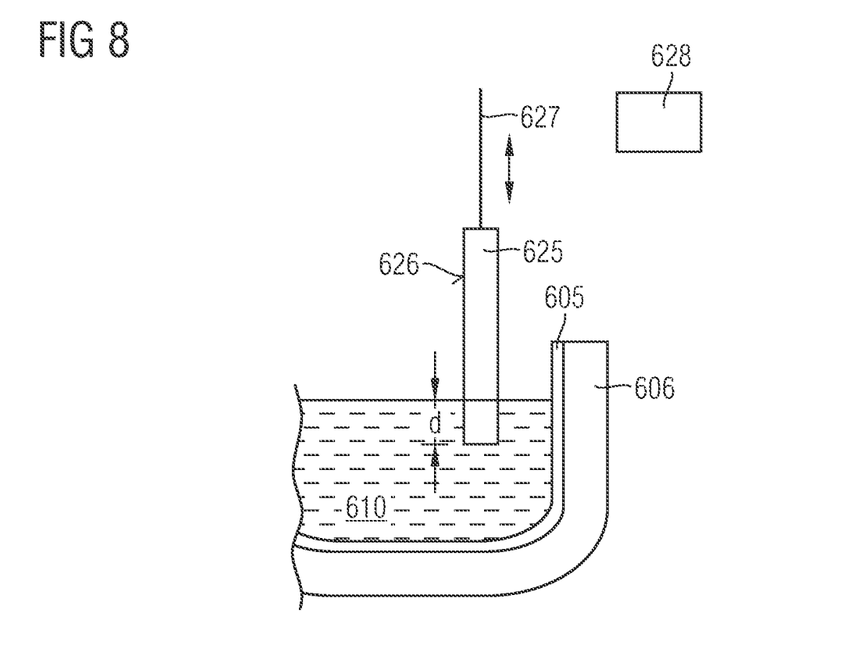
FIG. 8 is a schematic cross-sectional view of a part of a CZ growth system for illustrating a method of adding dopants to a silicon melt in the crucible.

According to another embodiment illustrated in the schematic cross-sectional view of FIG. 8, altering the rate of adding the boron to the silicon melt 610 includes altering a depth d of a dopant source material 625 dipped into the silicon melt 610.

According to another embodiment, altering the rate of adding the boron to the silicon melt 610 includes altering a temperature of the dopant source material 625. By way of example, by increasing a temperature of the dopant source material, e.g. by heating, the amount of boron introduced into the silicon melt 610 out of the dopant source material 625 may be increased. The dopant source material 625 is doped with the boron. According to an embodiment, doping of the dopant source material is carried out by one of in-situ doping, by a plasma deposition process through a surface 626 of the dopant source material 625, by ion implantation through the surface 626 of the dopant source material 625 and by a diffusion process through the surface 626 of the dopant source material 625. The dopant source material 625 may be shaped as a bar, a cylinder, a cone or a pyramid, for example. The dopant source material 625 may also be made of a plurality of separate dopant source pieces having one or a combination of different shapes. The depth d of a part of the dopant source material 625 that is dipped into the silicon melt 610 may be changed by a puller mechanism 627. The puller mechanism 627 holds the dopant source material 625, dips the dopant source material 625 into the silicon melt 610 and also pulls the dopant source material 625 out of the silicon melt 610. A control mechanism 628 is configured to control the puller mechanism 627. The control mechanism 628 may control the puller mechanism 627 by wired or wireless control signal transmission, for example.

According to another embodiment, altering the rate of adding the boron to the silicon melt 610 includes altering a flow or partial pressure of a boron carrier gas, e.g. diborane ($B_2H_6$) when doping the silicon melt 610 with boron from the gas phase.

According to an embodiment, the rate of adding the boron to the silicon melt 610 may be controlled depending on a length of the silicon ingot 612 from the seed crystal 614 to the silicon melt 610 during growth. According to another embodiment, the rate of adding the boron to the silicon melt 610 may be controlled based on a result of measuring a weight of the silicon ingot 612 and/or the dopant source material 625 during the Czochralski growth process. By way of example, the weight of the silicon ingot 612 and/or the dopant source material 625 may be measured by hanging up the silicon ingot 612 and/or the dopant source material 625 at a weighting unit, for example.

According to an embodiment, boron or another p-type dopant may be added prior to and/or during CZ growth by a p-dopant source material such as a p-dopant source pill. The p-dopant source material may have a predetermined shape such as a disc shape, spherical shape or a cubic shape. By way of example, the shape of the p-dopant source material may be adapted to the supply device 609 such as a dispenser configured to supply the p-dopant source material to a silicon melt 610 in the crucible 605. A time-dependent supply of a p-dopant into the silicon melt 610 may be achieved by adjusting a profile of p-type dopant concentration into a depth of the p-dopant source material, for example by multiple ion implantations at different energies and/or by forming a liner layer surrounding the p-dopant source material for controlling dissolving of the p-dopant from the p-dopant source material into the silicon melt 610 or for controlling the diffusion of the p-dopant out of the p-dopant source material into the silicon melt 610.

According to another embodiment, controlling the rate of adding the boron to the silicon melt 610 is carried out by optically measuring a change in dimensions of a quartz source material doped with the boron. Entrance of measurement light into the quartz source material may occur through a part of the quartz source material that protrudes from the silicon melt 610, for example. Altering the rate of adding the boron to the silicon melt 610 may also be carried out by altering at least one of a contact area between a dopant source material and the silicon melt and heating of the dopant source material. By altering the rate of adding boron to the silicon melt 610, an effective segregation of boron during CZ growth can be adapted to the segregation behavior of the n-type dopant(s) so as to achieve an n-type doping partially compensated by 20% to 80% with boron.

According to another embodiment, the net n-type doping is further compensated by a p-type dopant species having a segregation coefficient smaller than phosphorus in addition to boron. According to yet another embodiment, the net n-type doping is further compensated by a plurality of different p-type dopant species having segregation coefficients smaller than phosphorus. Carrying out partial compensation by boron having a segregation coefficient greater than phosphorus and by one or more p-type dopant species having segregation coefficients smaller than phosphorus, an effective segregation of p-type dopants during CZ growth can be adapted to the segregation behavior of phosphorus. This allows for a very effective compensation even in the case that source material is implemented prior to the start of the melting process. Gallium and aluminum are examples of p-type dopant species having a segregation coefficient smaller than phosphorus. The value of the resulting effective segregation coefficient can be adjusted by the ratio between the p-type dopant species with higher segregation coefficient and the p-type dopant species with lower segregation coefficient. Typically, the ratio between B and Al or Ga is at least 2, or even higher than 5 or even higher than ten for the case of phosphorus doping.

The method for manufacturing the silicon ingot 112 described above includes a partial compensation where donors in the n-doped silicon ingot 112 outnumber boron and optional further p-type dopants that are added to the silicon melt 110 during CZ growth.

An axial profile of doping caused by segregation of dopant material during CZ growth can be approximated by equation (1) below:

$$c(p) = k_0 c_0 (1-p)^{k_0-1} + F_0 \frac{k_0}{1-k_0}[(1-p)^{k_0-1} - 1] \quad (1)$$

The first term in the equation (1) refers to a doping that has been added to the melt before extracting the silicon ingot from the melt. According to the above embodiments, n-type dopant materials may be described by the first term of equation (1). The second term refers to adding dopant material at a constant rate into the melt during CZ growth. According to the above embodiments, adding the boron may be described by the second term of equation (1).

In the above equation (1), c(p) denotes a concentration of the dopant material in the silicon ingot (atoms/cm$^3$), p denotes a portion of the initial melt during CZ growth that has been crystallized and corresponds to an axial position between 0% and 100% of the completely grown silicon ingot, $k_0$ denotes a segregation coefficient of the dopant material, e.g. approx. 0.8 for boron (B) in silicon and approx. 0.35 for phosphorus (P) in silicon, $c_0$ denotes an initial concentration of the dopant material in the melt (atoms/cm$^3$) and $F_0$ denotes a total amount of the dopant material that is constantly (relative to the pulling rate) added to the melt divided by the initial volume of the melt (atoms/cm$^3$).

Figure 9:
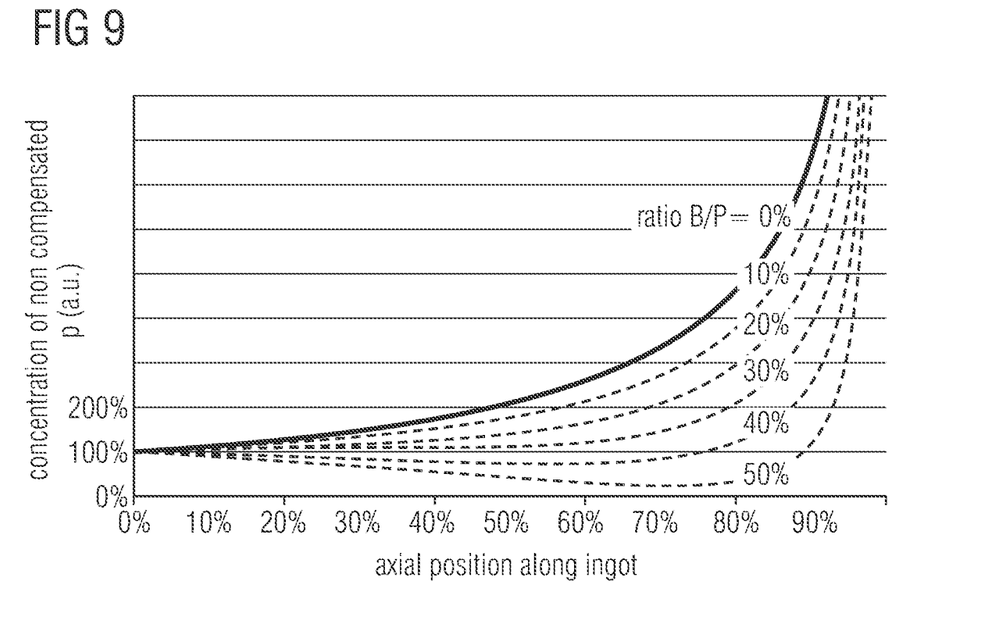
FIG. 9 is a graph illustrating a simulated concentration of non-compensated phosphorus along an axial position of a CZ grown silicon ingot with respect to different ratios of boron and phosphorus added to the silicon melt.

FIG. 9 illustrates calculated concentrations of non-compensated phosphorus (P), i.e. net n-doping versus an axial position between opposite ends of a silicon ingot. The illustrated curves refer to different ratios of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$).

The illustrated curves refer to values of $F_{OB}/c_{OP}$ of 0%, 10%, 20%, 30%, 40%, 50%. By adding boron to the melt during CZ growth and thereby adding a compensation dopant to the melt during the CZ growth, the method described with reference to FIGS. 5 to 8 allows for silicon wafers suitable for manufacturing semiconductor devices having improved robustness and reliability. When adding the boron to the melt before initiating CZ growth of the silicon ingot, homogeneity of the net n-doping concentration along the axial direction between opposite ends of the silicon ingot may be even worse than for the case of $F_{OB}/c_{OP}$ of 0%, i.e. without adding boron. This is due to the larger segregation coefficient of the compensation dopant boron compared to the segregation coefficient of the n-type dopant such as phosphorus. By partial compensation of at least 10% of P by B, an electrically active net doping concentration, which is based on a difference between the doping concentrations of the donors and acceptors varies by less than 60% from an average value for at least 40% of an axial length of the CZ silicon ingot. Variation may be even kept smaller by an optimized counteraction to segregation effects of the donors by compensation with acceptors having a different segregation behavior. Thereby, the electrically active net doping concentration may also vary by less than 40%, or less than 30%, or even less than 20% for the at least 40% of the axial length of the CZ silicon ingot.

Figure 10:
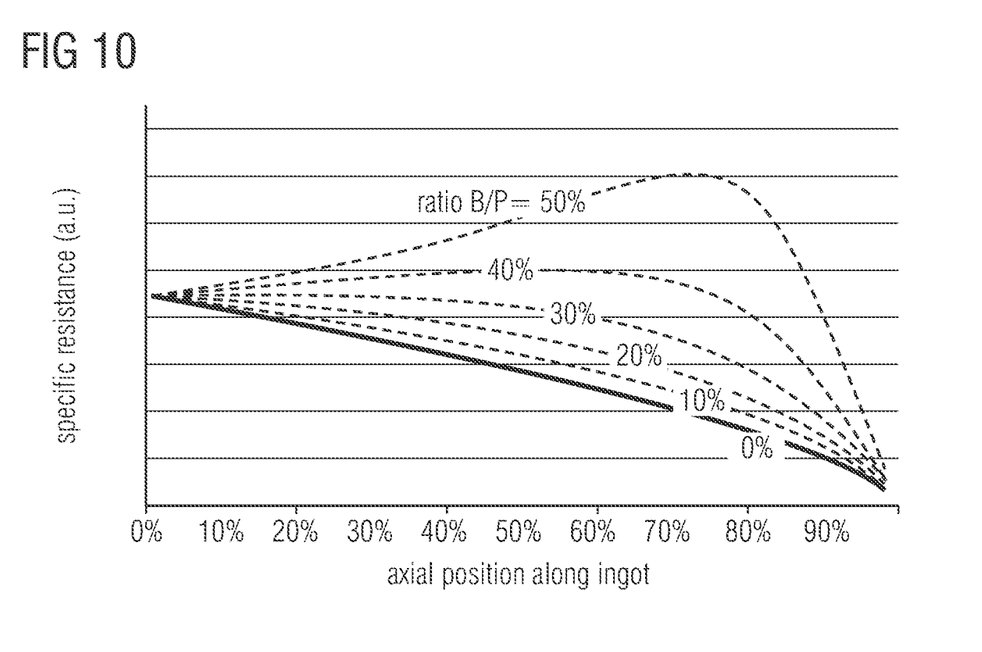
FIG. 10 is a graph illustrating a simulated specific resistance along an axial position of a CZ grown silicon ingot with respect to different ratios of boron and phosphorus added to the silicon melt.

FIG. 10 illustrates calculated specific resistance curves versus an axial position between opposite ends of a silicon ingot. Similar to the parameter curves illustrated in FIG. 9, the curves illustrated in FIG. 10 refer to different ratios of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$).

Similar to the parameter curves illustrated in FIG. 9, the curves illustrated in FIG. 10 refer to values of $F_{OB}/c_{OP}$ of 0%, 10%, 20%, 30%, 40%, 50%. By adding boron to the melt during CZ growth and thereby adding a compensation dopant to the melt during the CZ growth, the method described with reference to FIGS. 5 to 8 allows for improving homogeneity of the specific resistance along the axial direction between opposite ends of the silicon ingot and for silicon wafers suitable for manufacturing semiconductor devices having improved robustness and reliability.

Based on the method illustrated and described with respect to FIGS. 5 to 10, table 1 illustrates a maximum portion of the ingot along the axial direction having a specific fluctuation of specific resistance and a specific ratio of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$). Table 1 refers to values of $F_{OB}/c_{OP}$ of 0%, 10%, 20%, 30%, 40%, 50%, and to axial fluctuations of the specific resistance of +/−5%, +/−10%, +/−15%, +/−20%, +/−30%, +/−50%. By adding boron to the melt during CZ growth and thereby adding a compensation dopant to the melt during the CZ growth, the method described with reference to FIGS. 4 to 10 allows for a yield improvement by increasing the maximum portion of the ingot along the axial direction having a specific fluctuation of specific resistance. As an example, the axial portion of the ingot having a fluctuation of specific resistance of +/−10% may be increased from 26% (no compensation doping) to 78% (compensation doping $F_{OB}/c_{OP}$ of 40%).

TABLE 1

| boron compensation flow/initial doping with phosphorous | maximum ingot length with axial fluctuation of specific resistance of | | | | | |
|---|---|---|---|---|---|---|
| | +/−5% | +/−10% | +/−15% | +/−20% | +/−30% | +/−50% |
| no compensation | 14% | 26% | 36% | 46% | 60% | 80% |
| 20% | 32% | 48% | 58% | 66% | 76% | 88% |
| 30% | 56% | 66% | 74% | 78% | 84% | 92% |
| 35% | 66% | 74% | 78% | 82% | 86% | 92% |
| 40% | 38% | 78% | 82% | 84% | 88% | 92% |
| 45% | 22% | 44% | 84% | 86% | 88% | 94% |

According to the method illustrated with respect to FIGS. 9 and 10, boron is constantly added (relative to the pulling rate) to the silicon melt (described by the term $F_{OB}$ in atoms/cm$^3$) and phosphorus is added as an initial concentration to the melt (described by the term $c_{OP}$ in atoms/cm$^3$). According to other embodiments, boron may be added to the melt at an altering rate. Apart from or in addition to phosphorus, other n-type dopant materials such as antimony or arsenic may be used.

In addition to adding boron to the melt during CZ growth a part of the overall boron may also be added to the melt before CZ growth which may be described by a term $c_{OP}$ in equation (1). Likewise, in addition to adding phosphorus or another n-type dopant material as an initial concentration to the melt, a part of the phosphorus or the other n-type dopant may also be added to the melt during CZ growth which may be described by a term $F_{OP}$ in equation (1) in case of constantly adding the phosphorus or the other n-type dopant material relative to the pulling rate.

Slicing of the silicon ingot into silicon wafers may be carried out perpendicular to a central growth axis of the silicon ingot. According to an embodiment, slicing is carried out by an appropriate slicing tool such as an inner-diameter (ID) saw or a wire type saw, for example.

Proton irradiation and annealing as described with reference to embodiments above is carried out for generating hydrogen related donors in the silicon wafers, thereby achieving a fine tuning of the specific resistance of the silicon wafers. This means that at least one of adapting the absolute resistivity values of the wafers which were cut of the rod or ingot to the target resistivity and a minimization of the difference between the resistivity values of the wafers cut of the rod can be realized by the additional proton-induced n-type doping. Thereby, a variation of resistivity from wafer to wafer may be kept small, for example smaller than 10%, or even smaller than 5%.

The above embodiments serve merely as examples, and are not to be construed as limiting. Further, additional embodiments are provided below.

Embodiments

1. A semiconductor device, comprising: a silicon semiconductor body comprising a drift or base zone of net n-type doping, wherein an n-type doping is partially compensated by 10% to 80% with p-type dopants, a net n-type doping concentration in the drift zone is in a range from $1 \times 10^{13}$ cm−3 to $1 \times 10^{15}$ cm−3, and a portion of 5% to 75% of the n-type doping is made up of hydrogen related donors.

2. The semiconductor device of embodiment 1, wherein a ratio of segregation coefficients of n-type dopants in the drift or base zone and p-type dopants in the drift or base zone is in a range of 0.25 and 4.

3. The semiconductor device of embodiment 1, wherein the n-type doping comprises phosphorus partially compensated by boron.

4. The semiconductor device of embodiment 3, wherein the net n-type doping in the drift zone is further compensated by a p-type dopant species having a segregation coefficient smaller than phosphorus.

5. The semiconductor device of embodiment 3, wherein the p-type dopant species corresponds to at least one of aluminum and gallium.

6. The semiconductor device of embodiment 4, wherein a concentration ratio between boron and the at least one of aluminum and gallium is at least 2.

7. The semiconductor device of embodiment 1, wherein the net n-doping of the drift zone corresponds to a doping of a raw material of the silicon semiconductor body, and further comprising p-doped and n-doped regions having a net doping concentration greater than the net doping concentration in the drift zone.

8. The semiconductor device of embodiment 1, wherein the semiconductor device is one of an insulated gate bipolar transistor, a diode and an insulated gate field effect transistor.

9. The semiconductor device of embodiment 1, wherein the semiconductor device is a vertical power semiconductor device comprising a first load terminal at a first surface of the semiconductor body and a second load terminal at a second surface opposite to the first surface.

10. The semiconductor device of embodiment 1, wherein a variation of a profile of concentration of the hydrogen related donors along a vertical direction between opposite main surfaces of the semiconductor body is less than 80%.

11. A silicon wafer, comprising a net n-type doping, wherein an n-type doping is partially compensated by 10% to 80% with p-type dopants, the net n-type doping concentration is in a range from $1\times10^{13}$ cm−3 to $1\times10^{15}$ cm−3, and a portion of 5% to 75% of the n-type doping is made up of hydrogen related donors.

12. The silicon wafer of embodiment 11, wherein the n-type doping comprises phosphorus partially compensated by boron.

13. The silicon wafer of embodiment 11, wherein the net n-type doping is further compensated by a p-type dopant species having a segregation coefficient smaller than phosphorus.

14. The silicon wafer of embodiment 13, wherein the p-type dopant species corresponds to at least one of aluminum and gallium.

15. The silicon wafer of embodiment 14, wherein a concentration ratio between boron and the at least one of aluminum and gallium is at least 2.

16. A method of manufacturing a silicon wafer, the method comprising: extracting an n-type silicon ingot over an extraction time period from the a silicon melt comprising n-type dopants; adding p-type dopants to the silicon melt over at least part of the extraction time period, thereby compensating an n-type doping in the n-type silicon ingot by 10% to 80%; slicing the silicon ingot; and forming hydrogen related donors in the silicon wafer by irradiating the silicon wafer with protons and thereafter, annealing the silicon wafer.

17. The method of embodiment 16, wherein a portion of 5% to 75% of the n-type doping is made up of hydrogen related donors.

18. The method of embodiment 16, wherein a segregation coefficient of an n-type dopant species of the n-type dopants and a segregation coefficient of a p-type dopant species of the p-type dopants differ by at least a factor of three.

19. The method of embodiment 16, wherein the n-type dopant species is phosphorus and the p-type dopant species is boron.

20. The method of embodiment 19, further comprising adding, in addition to boron, a second p-type dopant species to the silicon melt over at least part of the extraction time period, second p-type dopant species having a segregation coefficient smaller than phosphorus.

21. The method of embodiment 20, wherein the second p-type dopant species corresponds to at least one of aluminum and gallium.

22. The method of embodiment 19, wherein the boron is added to the silicon melt from at least one of a boron doped quartz material or from boron in a gas phase.

23. The method of embodiment 19, wherein the boron is added to the silicon melt from a boron carbide or boron nitride source material.

24. The method of embodiment 19, wherein the boron is added to the silicon melt from a boron doped crucible.

25. The method of embodiment 24, wherein the boron doped crucible is formed by at least one of implanting boron into the crucible, diffusion of boron into the crucible and in-situ doping.

26. The method of embodiment 25, wherein the boron is implanted into the crucible at various energies and doses.

27. The method of embodiment 24, further comprising applying a thermal budget to the crucible by heating that is configured to set a retrograde profile of the boron in the crucible.

28. The method of embodiment 27, further comprising forming a layer at inner walls of the crucible.

29. The method of embodiment 19, further comprising altering a rate of adding the boron to the silicon melt.

30. The method of embodiment 29, wherein altering the rate of adding the boron to the silicon melt includes altering at least one of size, geometry and rate of delivery of particles, a flow or partial pressure of a boron carrier gas.

31. The method of embodiment 29, wherein altering the rate of adding the boron to the silicon melt includes at least one of altering a depth of a source material dipped into the silicon melt and altering a temperature of the source material, wherein the source material is doped with the boron.

32. The method of embodiment 31, wherein doping of the source material is carried out by one of in-situ doping, by a plasma deposition process through a surface of the source material, by ion implantation through the surface of the source material and by a diffusion process through the surface of the source material.

33. The method of embodiment 29, further comprising controlling a rate of adding the boron to the silicon melt by measuring a weight of the silicon ingot during the Czochralski growth process.

34. The method of embodiment 29, further comprising controlling a rate of adding the boron to the silicon melt by optically measuring a change in dimensions of a quartz source material doped with the boron.

35. The method of embodiment 29, further comprising altering a rate of adding the boron to the silicon melt by altering at least one of a contact area between a source material and the silicon melt and heating of the source material.

36. The method of embodiment 16, wherein adding the p-type dopants into the silicon melt includes dissolving p-type dopants from a p-type dopant source material into the silicon melt.

37. The method of embodiment 16, wherein irradiating the silicon wafer with protons includes an implantation dose in a range of $1\times10^{13}$ cm−2 and $8\times10^{14}$ cm−2, an implantation energy in a range of 1.0 MeV and 5.0 MeV, an annealing temperature in a range of 460° C. and 520° C., and an annealing duration in a range of 30 minutes and 20 hours.

38. The method of embodiment 16, further comprising reducing a thickness of the silicon wafer by removing material of the silicon wafer, thereby removing an end of range peak of proton irradiation.

39. The method of embodiment 16, further comprising measuring an electric or material characteristic of the semiconductor wafer, and setting at least one parameter of proton irradiation and annealing as a function of the measured electric or material characteristic.

The embodiments described herein may be combined. Although specific embodiments have been illustrated and described herein, it will be appreciated by those of ordinary skill in the art that a variety of alternate and/or equivalent implementations may be substituted for the specific embodiments shown and described without departing from the scope of the general inventive concept. This application is intended to cover any adaptations or variations of the specific embodiments discussed herein. Therefore, it is intended to be limited only by the claims and the equivalents thereof.

What is claimed is:

1. A method of manufacturing, the method comprising:
   extracting an n-type silicon ingot over an extraction time period from a silicon melt comprising n-type dopants;
   adding p-type dopants to the silicon melt over at least part of the extraction time period, thereby compensating an n-type doping in the n-type silicon ingot by 10% to 80%;
   slicing the n-type silicon ingot to form a silicon wafer;
   forming hydrogen related donors in the silicon wafer by irradiating the silicon wafer with protons; and
   annealing the silicon wafer subsequent to the forming of the hydrogen related donors in the silicon wafer.

2. The method of claim 1, wherein a portion of 5% to 75% of the n-type doping is made up of the hydrogen related donors.

3. The method of claim 1, wherein a segregation coefficient of an n-type dopant species of the n-type dopants and a segregation coefficient of a p-type dopant species of the p-type dopants differ by at least a factor of three.

4. The method of claim 1, wherein the n-type dopants are phosphorus and the p-type dopants are boron.

5. The method of claim 4, further comprising:
   adding, in addition to the boron, a second p-type dopant to the silicon melt over the at least part of the extraction time period, the second p-type dopant having a segregation coefficient smaller than phosphorus.

6. The method of claim 5, wherein the second p-type dopant corresponds to at least one of aluminum and gallium.

7. The method of claim 4, wherein the boron is added to the silicon melt from at least one of a boron doped quartz material or from boron in a gas phase.

8. The method of claim 4, wherein the boron is added to the silicon melt from a boron carbide or boron nitride source material.

9. The method of claim 4, wherein the boron is added to the silicon melt from a boron doped crucible.

10. The method of claim 9, wherein the boron doped crucible is formed by at least one of implanting the boron into a crucible, diffusion of the boron into a crucible, and in-situ doping.

11. The method of claim 10, wherein the boron is implanted into the crucible at various energies and doses.

12. The method of claim 9, further comprising:
    applying a thermal budget to the boron doped crucible by heating that is configured to set a retrograde profile of the boron in the boron doped crucible.

13. The method of claim 12, further comprising:
    forming a layer at inner walls of the boron doped crucible.

14. The method of claim 4, further comprising:
    altering a rate of adding the boron to the silicon melt.

15. The method of claim 14, wherein altering the rate of adding the boron to the silicon melt includes altering at least one of size, geometry and rate of delivery of particles, a flow or partial pressure of a boron carrier gas.

16. The method of claim 14, wherein altering the rate of adding the boron to the silicon melt includes at least one of altering a depth of a source material dipped into the silicon melt and altering a temperature of the source material, wherein the source material is doped with the boron.

17. The method of claim 16, wherein doping of the source material is carried out by one of in-situ doping, by a plasma deposition process through a surface of the source material, by ion implantation through the surface of the source material and by a diffusion process through the surface of the source material.

18. The method of claim 14, wherein extracting the n-type silicon ingot includes a Czochralski growth process of the n-type silicon ingot, the method further comprising:
    controlling the rate of adding the boron to the silicon melt by measuring a weight of the n-type silicon ingot during the Czochralski growth process.

19. The method of claim 14, further comprising:
    controlling the rate of adding the boron to the silicon melt by optically measuring a change in dimensions of a quartz source material doped with the boron.

20. The method of claim 14, further comprising:
    altering the rate of adding the boron to the silicon melt by altering at least one of:
    a contact area between a source material and the silicon melt, and
    heating of the source material.

21. The method of claim 1, wherein adding the p-type dopants into the silicon melt includes dissolving the p-type dopants from a p-type dopant source material into the silicon melt.

22. The method of claim 1, wherein:
    irradiating the silicon wafer with protons includes an implantation dose in a range of $1\times10^{13}$ cm$^{-2}$ and $8\times10^{14}$ cm$^{-2}$ with an implantation energy in a range of 1.0 MeV and 5.0 MeV, and
    annealing the silicon wafer includes an annealing temperature in a range of 460° C. and 520° C., and an annealing duration in a range of 30 minutes and 20 hours.

23. The method of claim 1, further comprising:
    reducing a thickness of the silicon wafer by removing material of the silicon wafer, thereby removing an end of range peak of the proton irradiation.

24. The method of claim 1, further comprising:
    measuring an electric characteristic or a material characteristic of the silicon wafer, and setting at least one parameter of the proton irradiation and the annealing of the silicon wafer as a function of the measured electric or the material characteristic.

* * * * *